United States Patent [19]

Domm

[11] Patent Number: 4,973,216
[45] Date of Patent: Nov. 27, 1990

[54] APPARATUS FOR AUTOMATIC COMPONENT INSERTION IN P.C. BOARDS

[75] Inventor: Martin Domm, Ilsfeld, Fed. Rep. of Germany

[73] Assignee: Rohde & Schwarz Engineering and Sales GmbH, Fed. Rep. of Germany

[21] Appl. No.: 377,204

[22] Filed: Jul. 10, 1989

[30] Foreign Application Priority Data

Jul. 14, 1988 [DE] Fed. Rep. of Germany ....... 3823836

[51] Int. Cl.$^5$ .................................................. B25J 9/06
[52] U.S. Cl. .................................... 414/744.5; 29/759; 29/741; 29/721; 901/47
[58] Field of Search ................... 414/225, 744.3, 744.5; 294/66.2; 901/47, 15; 29/720, 721, 740, 741, 759

[56] References Cited

U.S. PATENT DOCUMENTS

| 4,380,696 | 4/1983 | Masaki | 901/47 X |
| 4,706,515 | 11/1987 | Yasukawa | 901/15 |
| 4,727,471 | 2/1988 | Driels et al. | 901/47 X |
| 4,753,569 | 6/1988 | Pryor | 901/47 X |

FOREIGN PATENT DOCUMENTS 0234904 9/1987 European Pat. Off. .
3546216 7/1988 Fed. Rep. of Germany .

Primary Examiner—Frank E. Werner
Assistant Examiner—Donald W. Underwood

[57] ABSTRACT

In an apparatus for automatic component insertion in p.c. boards by means of an industrial robot, the gaging means for optically gaging the components is disposed on the outer robot arm so as to be directly associated with the range of motion of the component gripped by the robot.

3 Claims, 2 Drawing Sheets

APPARATUS FOR AUTOMATIC COMPONENT INSERTION IN P.C. BOARDS

BACKGROUND OF THE INVENTION

1. Field of the Invention

The invention concerns an apparatus for automatic component insertion in p.c. boards as specified in the preamble of the main claim.

2. Description of the Prior Art

An apparatus of the specified kind is known (EP-OS 0,234,904). The video camera used in this case as gaging means is fixedly disposed beside the robot, and the robot arm initially moves the component to be inserted from the ready position across this stationary video camera where the tips of the component leads are gaged from below by the video camera and the gaging result is compared with the gaging result obtained for the drill holes of the p.c. board, which are gaged by a separate second video camera. If no displacement of the leads is detected during this operation, the robot advances the component further to the insertion position above the p.c. board, and the gripper of the robot then lowers the component onto the p.c. board to thereby insert the component leads into the corresponding drill holes of the p.c. board. In this known apparatus the robot arm during its travel from the ready position to the insertion position has to make a detour via the stationary gaging means, said detour taking up about 30% of the cycle time. Moreover, the known apparatus with the gaging means for gaging the component from below is not suited for every type of component but is limited to gaging of electronic components having downwardly depending leads.

Similar considerations hold for another known apparatus of the specified kind (DE-OS 3,546,216), in which chip carriers are transported by means of a vacuum chuck from a ready position to the insertion position above a p.c. board. Here, too, the chip leads are gaged from below by means of a video camera. Therefore this known apparatus is also suitable only for the insertion of chip carriers; because of the use of a vacuum chuck and gaging from below the apparatus would be unsuited for inserting other components such as mechanical components.

SUMMARY OF THE INVENTION

It is the object of the present invention to provide an apparatus for automatic component insertion in p.c. boards, which is suited without loss of cycle time for gaging and inserting any desired types of components.

Starting out from an apparatus as specified in the preamble of the main claim, the specified object is solved by the characterizing features thereof. Advantageous further improvements will be apparent from the subclaims.

Due to the inventive mounting of the gaging means direct on the robot arm adjacent the gripper it becomes possible to gage the component laterally from the side at two or more different positions of angular rotation. This will not only permit accurate gaging of the leads of electronic components but also of any other electrical or mechanical components, for with lateral gaging it is possible, for example, also to gage threads and the straightness of a bolt that is to be inserted. Since with gaging at two different angular positions, for example at two positions offset by 90° relative to each other, different gaging results for one and the same component are obtained so that the depending leads of an electronic component are gaged from two different directions, it is possible with these gaging results to accurately calculate the shape of the component, for example the position of the component leads. It is then only necessary to input this gaging result, which exactly describes the component, in the robot control. This enables a highly universal use of the apparatus according to the present invention. Gaging of the component from the side is also accompanied by the significant advantage that gaging at different angular positions is always performed with the same neutral background so that no additional error eliminating measures are required as in the case of the known apparatus, where gaging of the components is done from below so that special illuminating means must be employed in order to prevent faulty gaging due to unsteady background or different background in the case of different components. It is especially advantageous in this connection to dispose the light source immediately opposite the gaging means so that the optical gaging means takes a sharp, high-contrast side image of the gaged component, said image being independent of any environmental influences and scattered light. It is especially advantageous to use a red-light source and to have a corresponding red-light filter cooperating with the gaging means, for example a video camera, since it is thereby possible to completely exclude scattered daylight whereby highly accurate gaging of the component is ensured. Moreover, due to the direct mounting of the gaging means on the robot arm adjacent the gripper no detour for gaging purposes is required so that about 30% of the available robot cycle time is saved; therefore the insertion operation can be performed at a considerably higher speed than with the apparatus previously known. Due to the fact that gaging is performed during transport of the component from the ready position to the insertion position it is possible without any loss of cycle time to gage the component from various angular positions, and the gaged values can be compared with the specified values stored in a database for the various components; if the gaging result is within the predetermined tolerance range the component can be directly inserted into the p.c. board, and if the component dimensions differ from the acceptable tolerance values the component will either be put down as not-go component or will be transferred to a separate aligning means for correction of the sensed defects, for example for alignment of the displaced leads of the component. The apparatus according to the invention is not only suited for gaging the leads of electronic components but is also useful for gaging other components such as measuring probes, bolts or the like where corresponding tolerances must be observed. An especially suitable gaging means is a video camera with associated light source, but a laser scanner could be used as well. The apparatus according to the invention is suited for any kind of multi-axis industrial robot provided that the control motion of the robot arm for transporting the components from the ready position to the insertion position is disconnected from the control motion of the gripper for gripping the component, i.e., that the displacement and/or rotation of the gripper can be controlled independently of the control motion of the remaining robot arm so that the component on the one hand adopts the desired various angular positions for the gaging operation and finally, upon completion thereof, adopts the proper insertion position. With the apparatus according to the invention it is also possible to perform corresponding corrective movements of the industrial robot in response to the gaged values.

DESCRIPTION OF THE PREFERRED EMBODIMENTS

Figure 1:
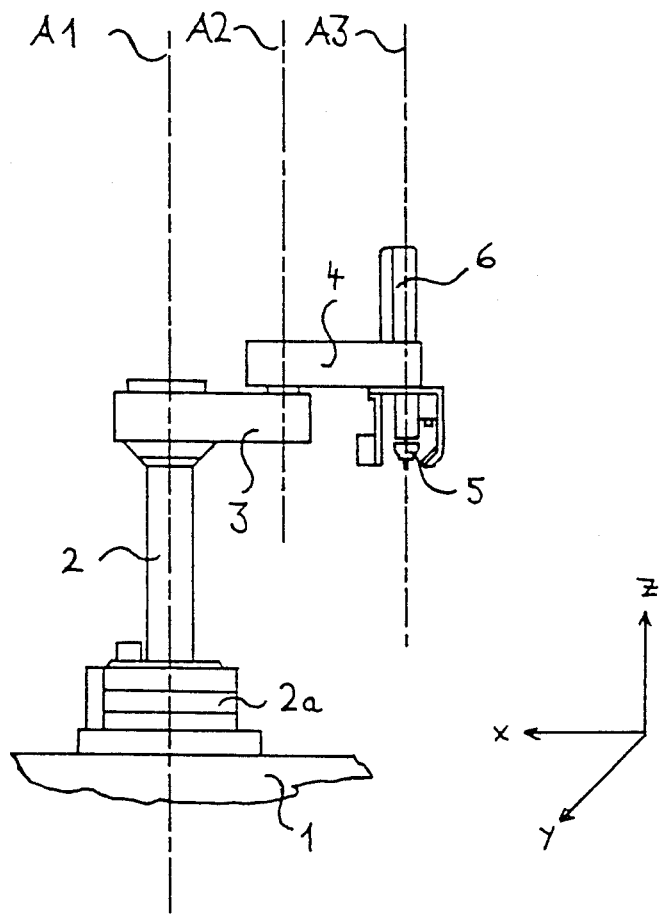
FIG. 1 is an overall view of an apparatus according to the invention for automatic component insertion in p.c. boards.

FIG. 1 illustrates a commercially available three-axis industrial robot, for example a so-called Scara robot made by Adept Technology. On a stand 2 mounted on a base 1, an inner articulated arm 3 is mounted for rotation about an axis $A_1$. An outer articulated arm 4 is mounted for rotation about an axis $A_2$. The outer articulated arm 4 carries a gripper 5 which is rotatable about an axis $A_3$ of the articulated arm and is movable along said axis in z-direction With this arrangement the gripper 5 can be moved in a plane including the two coordinate directions x,y to the insertion position, and it can be rotated about its own axis to such an extent as to adopt the angular position required for the insertion operation, and it can be lowered in z-direction for inserting the component 11 into the p.c. board (not illustrated). A drive mechanism 6 mounted on the outer articulated arm 4 functions to drive the gripper 5 in z-direction and for rotation about its axis and for opening and closing the gripper. All movements of the industrial robot and of the gripper 5 are controlled as known per se by a programmable control mounted, for example, in the bottom 2a of the stand 2.

Figure 2:
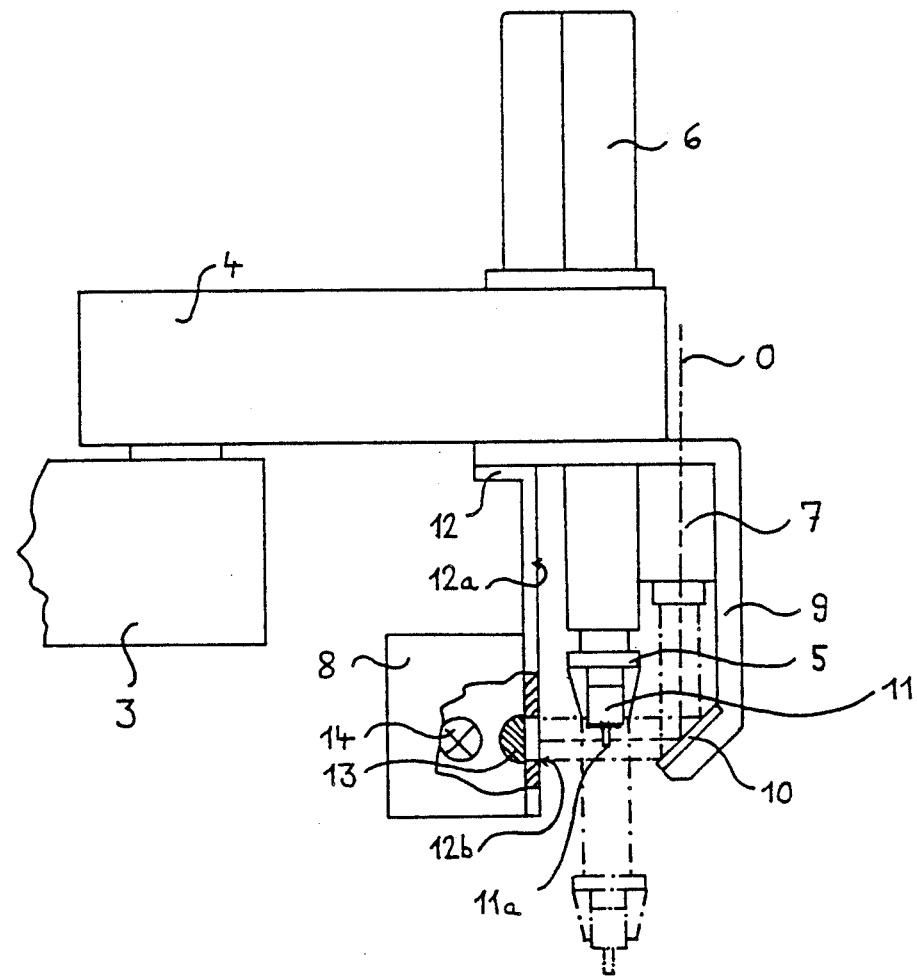
FIG. 2 illustrates details of the gaging means used in this connection.

As will be apparent especially from FIG. 2, a video camera 7 and a lighting box 8 are mounted on the outer articulated arm 4. The video camera 7 is secured to a bracket 9 which is connected to the outer articulated arm 4. By means of a deflecting mirror 10, which is likewise secured to the bracket 9, the optical path 0 of the video camera 7 is guided to a viewing location through which the component 11 gripped by the gripper 5 passes while being moved in z-direction. It is preferred that the deflecting mirror 10 is disposed so that the component 11 to be gaged, for example the leads 11a of an electronic component 11, is exactly in the centre of the image field of the video camera 7 when the gripper 5 adopts its fully retracted uppermost position.

The lighting box 8 is disposed in a position which, as viewed from the video camera 7 or the deflecting mirror 10, is behind the gripper 5 and the component 11 gripped thereby. The box is mounted on a bracket 12 which is likewise secured to the outer articulated arm 4. The surface 12a of the bracket 12 forms a co-moving background for the video camera 7 so that it is possible, for example, to provide thereon gage marks for the component 11.

In the surface of the brackes 12 there is formed a through-opening 12b for light from a light source 14, said through-opening being in alignment with a corresponding through-opening in the lighting box 8. Light from the light source 14 is focused by means of an optical condenser 13 onto the viewing position for the component 11, so that the leads 11a of the component 11 appear in the video camera 7 as sharply defined silhouette.

Rotation of the gripper 5 about its axis is controlled by the control so that the leads 11a are gaged from two directions which are mutually offset by 90°. So as to enable this gaging operation to be performed within the cycle time which is required in any case for the movement of the gripper towards the insertion position, the movement of the articulated arms 3 and 4 is disconnected from the movement of the gripper 5. The gripper movement is divided into such a number of preferably approximately equal partial movements as are necessary for transferring the component 11 during movement of the gripper 5 between the ready position and the insertion position from the angular position adopted in the ready position to the two 90°-positions required for gaging and subsequently to the angular position required for insertion and thereafter lowering the component onto the p.c. board. For gaging components having but two leads 11a it will generally suffice to perform gaging in only two different angular positions of 90°, for example. For electronic components including plural depending leads it may, however, be appropriate to perform gaging at several different angular positions. The apparatus according to the invention is also suited for robots which can be adjusted about more than three axes and which, for example, also permit insertion of components at an inclination. In the last-mentioned case it is even possible to insert components at predetermined inclined positions into the p.c. board.

Although I have described my invention by reference to particular illustrative embodiments thereof, many changes and modifications of the invention may become apparent to those skilled in the art without departing from the spirit and scope thereof. I therefore intend to include within the patent warranted hereon all such changes and modifications as may reasonably and properly be included within the scope of my contribution to the art.

I claim:
1. Apparatus for automatic component insertion in printed circuitboards by means of an industrial robot, in which the result of multiple optical gaging is input into a programmable control of the robot and is taken into account when inserting components into the printed circuitboards, comprising:
   an inner articulated arm;
   an outer articulated arm mounted on said inner articulated arm;
   a rotatable and extensible gripper mounted on said outer articulated arm of the robot by which the components are transferred from a ready position to an insertion position where they can be inserted into a printed circuit board, said gripper including a rotary axis;
   a video camera including an optical axis and mounted on said camera including an optical axis and mounted on said outer articulated arm so as to be directly associated with the range of movement of a component gripped by said gripper for optically gaging the component from the side during its transfer from the ready position to the insertion position, whereby the component is gaged laterally in at least two different angular positions of said gripper about its rotary axis;
   said video camera mounted on said outer articulated arm such that said optical axis of said video camera extends parallel to said rotary axis of said gripper;

a deflecting mirror mounted to deflect the optical path of said video camera in the direction of the range of movement of the component; and a light source disposed opposite said deflecting mirror behind the range of movement of the component and operating to directly radiate onto the deflecting mirror and thereby onto the component and the video camera.

2. The apparatus of claim 1, wherein:

said deflecting mirror is mounted on said outer articulate arm of said robot such that the field of gaging is allocated to that area which is taken up by the component in a fully retracted position of said gripper.

3. The apparatus of claim 1, and further comprising:

a bracket mounting said light source to said outer articulated arm, said including an aperture therethrough; and said light source is mounted to radiate through said aperture directly onto said deflecting mirror.

* * * * *